United States Patent

Lung-Han et al.

(10) Patent No.: US 6,295,159 B1
(45) Date of Patent: Sep. 25, 2001

(54) METHOD FOR BULK PERIODIC POLING OF CONGRUENT GROWN FERRO-ELECTRIC NONLINEAR OPTICAL CRYSTALS BY LOW ELECTRIC FIELD

(75) Inventors: Peng Lung-Han; Lin Yi-Chin; Fang Yi-Chen, all of Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/457,448

(22) Filed: Dec. 8, 1999

(30) Foreign Application Priority Data

Sep. 7, 1999 (TW) .................................................. 88115359

(51) Int. Cl.[7] .................................................. B29C 71/04
(52) U.S. Cl. .................................................. 359/326; 117/2; 264/430
(58) Field of Search .................................................. 359/326–332; 385/122; 372/21, 22; 264/430; 117/1–3

(56) References Cited

U.S. PATENT DOCUMENTS

| | | | | |
|---|---|---|---|---|
| 5,317,666 | * | 5/1994 | Agostinelli et al. | 385/122 |
| 5,519,802 | * | 5/1996 | Field et al. | 385/129 |
| 5,615,041 | * | 3/1997 | Field et al. | 359/326 |
| 5,748,361 | * | 5/1998 | Gupta et al. | 359/332 |
| 5,756,263 | * | 5/1998 | Gupta et al. | 430/317 |
| 5,766,340 | * | 6/1998 | Geosling | 117/2 |
| 5,800,767 | * | 9/1998 | Byer et al. | 264/430 |
| 5,875,053 | * | 2/1999 | Webjorn et al. | 359/326 |

* cited by examiner

*Primary Examiner*—John D. Lee

(57) ABSTRACT

A new method is proposed and demonstrated effectively in reducing the coercive field and internal field in association with bulk periodical poling of the congruent grown ferro-electric nonlinear optical crystal. By adequate doping with zinc oxide, the coercive field required for achieving 180° domain reversal and the internal field associated with the non-stoichiometric point defects in undoped congruent grown ferro-electric nonlinear optical crystals can be reduced by an order of magnitude.

15 Claims, 16 Drawing Sheets

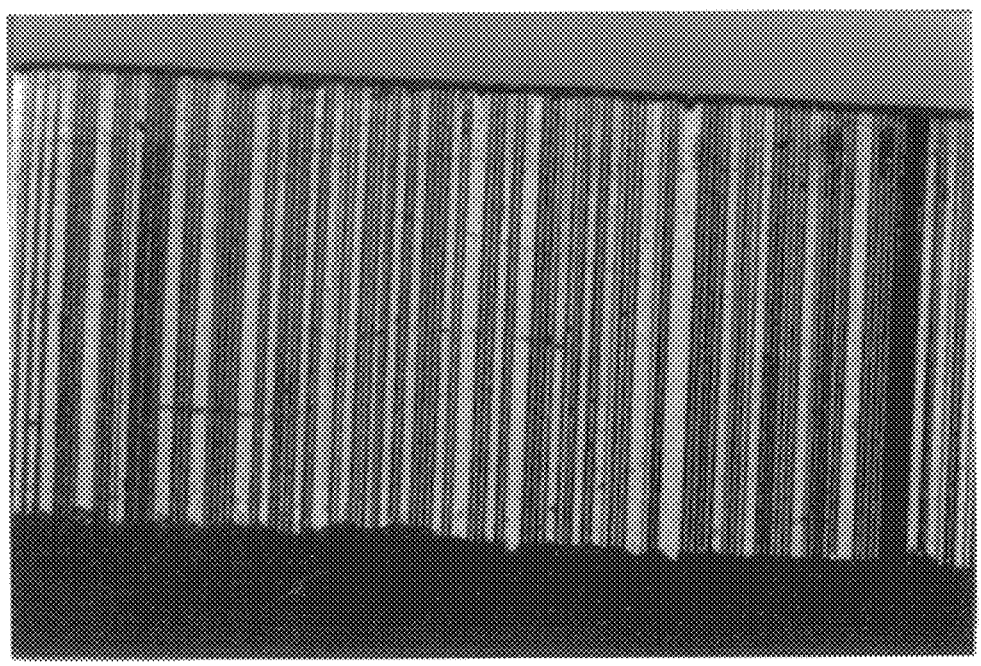
ENCLOSE 1

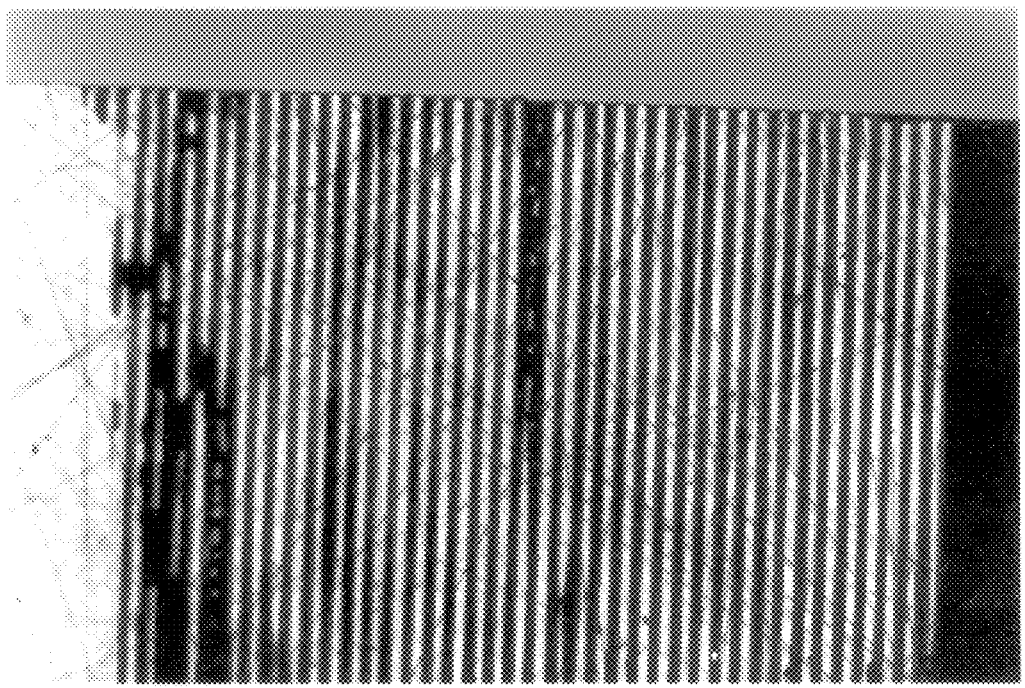
ENCLOSE 2

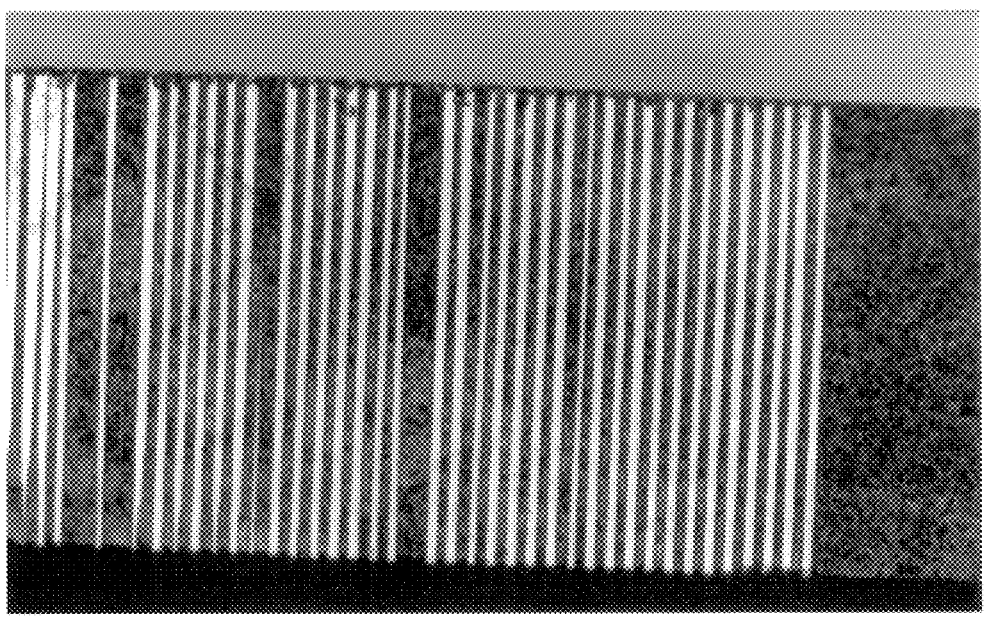
ENCLOSE 3

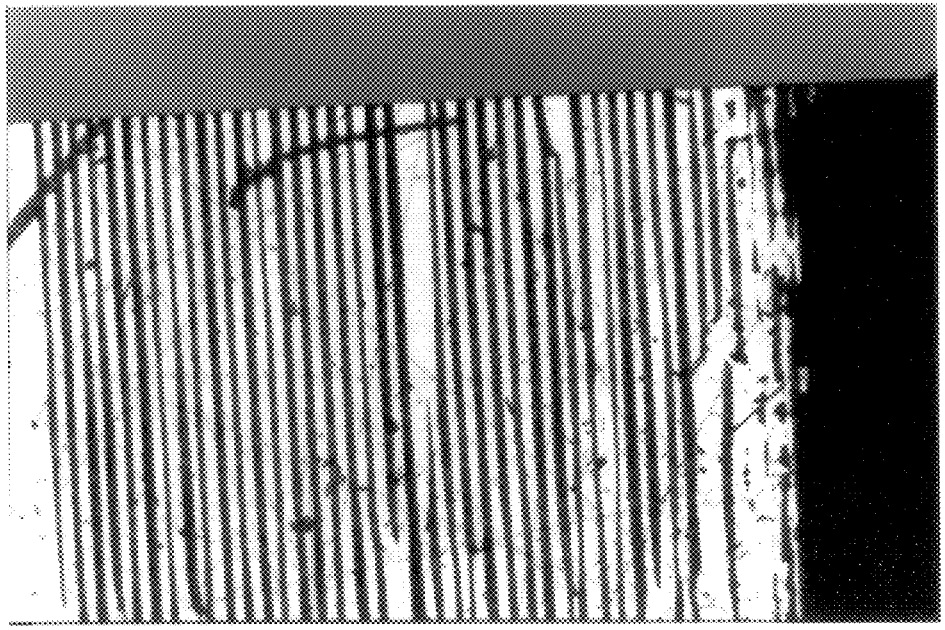
ENCLOSE 4

METHOD FOR BULK PERIODIC POLING OF CONGRUENT GROWN FERRO-ELECTRIC NONLINEAR OPTICAL CRYSTALS BY LOW ELECTRIC FIELD

FIELD OF THE INVENTION

The present invention generally relates to a method for bulk periodic poling of congruent grown ferro-electric nonlinear optical crystals by low electric field, and more particularly, to a method in which the coercive field and internal field associated with the congruent grown ferro-electric nonlinear optical crystals can be greatly reduced in the domain reversal process of Z-cut congruent grown ferro-electric nonlinear optical crystals by doping with oxide of suitable concentration on the congruent grown ferroelectric nonlinear optical crystals.

BACKGROUND OF THE INVENTION

Recently, in the field of electro-optical information technology, especially the techniques related to a short wavelength laser source useful in the digital optical head are widely discussed. In 1962, Prof Bleombergen et al. at Harvard University (U.S.A.) made theoretical calculation and proposed a quasi-phase matching (to be abbreviated as QPM here below) algorithm of converting a fundamental wave to a second harmonic wave by setting pitches and modulating the polarities of the second order non-linear coefficients to obtain a periodical domain reversal structure. Such knowledge is disclosed in, for example, Phys. Rev., vol. 127, No. 6, 1918 (1962) and U.S. Pat. No. 3,384,433 (1968). FIG. 1 shows a general periodic domain reversal structure, which describes the relation of distance and second harmonic generation (to be abbreviated as SHG here below) and the comparison under quasi-phase matching and phase mismatching conditions. In such a method, the problem of phase mismatching defined as the wave vector difference between the fundamental wave and the nonlinear optical wave in the propagation direction can be overcome by the addition of a wave vector of $2\pi/\Lambda$ from the periodically poled structure with a period of $\Lambda$.

The QPM method has advantages over the commonly used birefringence phase matching method in conventional non-linear optical crystals in that the former uses the maximized second order non-linear coefficient $d_{33}$ to ensure that all three waves involved in the nonlinear frequency conversion process are polarized in the same direction. Accordingly, the walk-off angle problem arisen from the angular deviation between the fundamental and nonlinear waves of different polarization in the conventional birefringence phase matching method can therefore be avoided.

So far, the QPM structures on the non-linear optical crystals have been realized by either diffusion methods or crystal growth methods. The former include a method for domain reversal by making use of proton exchange or metal-induced diffusion process, and the latter a method of using temperature gradient during the process of crystal growth to modulate of the direction of spontaneous polarization. Such knowledge is disclosed in, for example, IEEE J. Quantum Electronics, vol. 33, No. 10, p. 1673 (1997) by Webjorn el al.. However, due to the crystal directional dependence of the diffusion process, the use of diffusion method often results in a shallow domain reversed region of triangular profiles. The latter deviates strongly from the idea case of 180° domain reversal as shown in FIG. 1 of the prior art. In addition, the irregularities associated with the diffusion process that occurs at the domain boundaries can greatly reduce the second order nonlinear optical coefficient. Such knowledge is disclosed in, for example, by Veng et al. in Appl. Phys. Lett. Vol. 69, No. 16, p. 2333 (1996), and by Webjorn et al. in IEEE Photonics Technol. Lett., vol. 1, No. 10, p. 316 (1989). A combination of these effects leads to a substantial reduction in the efficiency of nonlinear frequency conversion using the diffusion method. On the other hand, the use of temperature control method in achieving periodical poling of nonlinear optical crystals is limited to small sample size. See, for example, Magel et al. in Appl. Phys. Lett., vol. 56, No. 2, p. 108 (1990).

The other related prior arts will be briefly reviewed hereinafter: to begin with, in 1993, Yamada et al. with Sony Corp. (Tokyo, JP) reported the formation of bulk type of periodically poled lithium niobate (to be abbreviated as PPLN here below) QPM structures with a small period of $\Lambda = 2L_c = 5.6\ \mu m$ on the thin lithium niobate substrate of two hundred micrometers (200 $\mu$m) in thickness by applying a high pulse voltage across the electrodes, where $L_c$ denotes the coherence length defined as $L_c = \pi/(k_{2\omega} - 2k_{\omega})$. They further claimed that the conversion efficiency of the second harmonic generation (SHG) waveguide is 600%/W-cm$^2$, much higher than that in prior arts. However, since the electric field necessary for domain reversal is as high as 24 kV/mm, the experiment can only be processed in oil or under high vacuum condition, to be more precisely, a pressure lower than $10^{-5}$ torr to avoid dielectric breakdown. M. Yamada and T. Yamaguchi with Sony Corp. hold U.S. Pat. Nos. 5,526,173 (1996), 5,249,250 (1993), and 5,193,023 (1993) for their research in bulk periodic poling of lithium niobate.

Sony Corp. holds U.S. Pat. No. 5,526,173 (1996) "Method of local domain control on non-linear optical crystals" for their design on the plural form of electrodes on the periodically poled lithium niobate (PPLN) structures to reduce the fringe field effects. The latter arises from the dielectric discontinuity in preparing the PPLN samples and can lead to substantial lateral domain motion in the high field poling process. As a result, a high fidelity of 50-50% duty cycle in the ideal quasi-phase matching (QPM) structures of small period for short wavelength conversion becomes difficult to achieve.

Please refer to FIGS. 2A to 2C, in which the fringe field effect is described. As shown in FIG. 2A, symbol 20 denotes the lithium niobate substrate, on which is coated with a layer of photoresist 10. FIG. 2B and FIG. 2C represent the electric field distribution along the crystal+z axis and the x-axis, respectively, as a function of distance away from the top surface of the electrode. In the figures, the x-coordinate and y-coordinate represents, respectively, the normalized distance ($x/\Lambda_c$), and normalized field strength ($E/E_{applied}$), where $\Lambda_c$ denotes the period of the QPM structure and $E_{applied}$ the applied poling field strength. Such knowledge is disclosed in, for example, by Rosenman et al., in Appi. Phys. Lett. vol. 73, No. 7, p. 865 (1998).

From the principle of the electromagnetic theory, it is known that the discontinuity of dielectric distribution such as seen in FIG. 2 of the prior art due to the coating of photo-resist and evaporation of Al metal in preparing the PPLN samples, would cause the discontinuity of electric field (i.e. the so-called fringe field effect) at the edges of the electrodes. Since the fringe field at the edges of the electrodes is much higher than the corresponding coercive field required for achieving a 180° polarization switching, the domain reversal process will hence proceed along the crystal z- and x- axis. The former procedure is known to result in a fast 180° reversed domain formed in the crystal z direction, while the latter can cause a lateral 180° domain motion not restricted to the areas defined by the electrodes. A loss of 50-50% duty cycle fidelity in the QPM structures due to the fringe field effects can therefore generates phase mismatching and thus reduce the nonlinear frequency conversion efficiency.

In addition to control the lateral 180° domain motion, another important consideration in fabricating periodically poled QPM structures is the capability to stabilize the reversed domain structure. In the conventional electric poling process on congruent grown ferro-electric crystals, the switching off of the high voltage source at the end of the poling process can introduce a charge back-flow current according to i=C dv/dt. The latter can cause a relaxation of the inverted polarization back to its original direction such that the periodically poled structures previously formed during the high voltage switching on period can thereby be partially washed out. In the U.S. Pat. No. 5,652,674 "Method for manufacturing domain-inverted region, optical wavelength conversion device utilizing such domain-inverted region and method for fabricating such device", K. Mizuuchi and K. Yamumoto with Matsushita Electric Industral Co., Ltd. (Kadoma, Japan) applied a combination of DC and pulse voltage to reduce such a charge back flow process on thin polished lithium tantalate ($LiTaO_3$) substrate of two hundred micrometers (200 $\mu$m) in thickness.

In the U.S. Pat. No. 5,838,486 (1998) "Optical wavelength conversion element, method of manufacturing the same and optical wavelength conversion module", Sonoda et al. with Fuji Photo Film Co., Ltd. (Kanagawa-ken, Japan) proposed a method in which a Y-cut magnesium oxide doped lithium niobate ($MgO:LiNbO_3$) substrate tilted at an angle $\theta$ larger than zero degree and smaller than ninety degrees is used to fabricate shallow type of reversed domain structure of QPM structures with reversed domain of two to three micrometers (2~3 $\mu$m) in depth. Magnesium oxide doped lithium niobate has advantages over undoped lithium niobate in that the optical damage resistance of the former is at least ten times greater than that of the latter, and the non-linear coefficient $d_{33}$ of the former is larger than that of the latter. Such knowledge is disclosed in, for example, Nakamura et al. in Jpn. J. Appl. Phys., vol. 38, No. 5A, p. L512 (1999).

Recent invention on the technique of fabricating PPLN also- includes the U.S. Pat. No. 5,800,767 (1998) "Electric field domain patterning", by Byer et al. with Stanford University (Stanford, Calif.) in which a liquid electrode method is proposed for periodic poling of lithium niobate.

Despite vast interest in applying periodically poled lithium niobate (PPLN) and periodically poled lithium tantalate (PPLT) for nonlinear frequency generation, great challenge remains in reducing the coercive field strength, which is generally larger than 21 kV/mm, such that fine 180° domain reversed QPM structures with smaller period can be fabricated on PPLN and PPLT. In the above mentioned technology, substrates made of congruent grown lithium niobate or lithium tantalate have become the crystal of choice due to the well established crystal growth techniques. However, it is known that the congruent grown lithium niobate and lithium tantalate suffer from the crystal nonstoichiometry such that an large internal field on the order of 2.5 kV/mm associated with the anti-site or vacancy point defects exists along the crystal +Z axis. Such knowledge is disclosed in, for example, J. Phys. Chem. Solids, vol. 52, No. 2, p. 185 (1991) by Schirmer et al., and in Appl. Phys. Lett. vol. 72, No. 16, p. 1981 (1998) by Gopalan et al.

Recently, a promising method of reducing the coercive and internal field on lithium niobate and lithium tantalate has been discovered by Kitamura et al. They report a use of double crucible Czochralski method to grow stoichiometric crystals, and the measured coercive fields are reduced to 4.5 kV/mm and 1.5 kV/mm, and the internal field reduced to less than 0.5 kV/mm, respectively, for the stoichiometric grown lithium niobate and tantalate crystals. Such knowledge is disclosed in, for example, Appl. Phys. Lett., vol. 73, No. 21, p. 3073 (1998), and in Appl. Phys. Lett. vol. 72, No. 16, p. 1981 (1998).

BRIEF DESCRIPTION OF THE INVENTION

The present invention provides a new method in achieving bulk type of 180° domain reversed QPM structures on congruent grown ferro-electric nonlinear optical crystals with reduction in the coercive field and internal field strength by using oxide as dopant in the congruent grown ferro-electric nonlinear optical crystals. In said method, the difficulty in applying a complex combination of DC and AC high voltage in the U.S. Pat. No. 5,652,674 in stabilizing the domain reversed structures can be overcome by using a high voltage rectifier diode to inhibit the relaxation of the spontaneous polarization back to its original direction. In addition, the dynamics of domain reversal in periodical poling of the congruent grown ferro-electric nonlinear optical crystals has been investigated in the present invention, which further provides and verifies a method in which the congruent grown ferro-electric nonlinear optical crystal is adequately doped (for instance, >0.5 mol. %) withoxide, , in order to greatly reduce the coercive field to 2.5 kV/mm and obtain bulk type of periodically poled oxide doped congruent grown ferro-electric nonlinear optical crystal of 500 $\mu$m thickness.

Accordingly, it is the main object of the present invention to provide a method for bulk periodic poling of congruent grown ferro-electric nonlinear optical crystals by low electric field and to accomplish the following objects for industrial applications, 1. to implement bulk type of periodically poled congruent grown ferro-electric nonlinear optical crystals with a small period $\Lambda=2L_c<7$ $\mu$m by applying a pulse voltage or a DC voltage at room temperature.

2. to achieve real-time monitoring of the change in current of the discussed domain reversal process in order to investigate the dynamics and changes of said polarization switching process in the congruent grown ferro-electric nonlinear optical crystals.

3. to further verify the mobility model in analyzing the dynamics of domain reversal in the congruent grown ferro-electric nonlinear optical crystals in accordance with said real-time monitoring method.

4. to greatly reduce the coercive field in congruent grown ferro-electric nonlinear optical crystals by adding suitable choice of dopant such as zinc oxide to reduce the nonstoichiometric point defects and to reduce the internal field associated with said point defects resultant from said crystal growth method.

5. to implement bulk periodic poling of the congruent grown ferro-electric nonlinear optical crystals by low electric field in accordance with said impurity doping method.

Accordingly, to accomplish the foregoing objects, the present invention provides a method for bulk type of periodic poling on the congruent grown ferro-electric nonlinear optical crystals of 500 $\mu$m substrate thickness, in which the use of zinc oxide as dopant in the congruent grown ferro-electric nonlinear optical crystals, that is, zinc oxide doped congruent grown ferro-electric nonlinear optical crystals is used to reduce the coercive field require for achieving 180° domain reversal in said congruent grown ferro-electric non-linear optical crystal. The fringe field effects associated with the applied voltage across the electrode edges can thus be minimized due to the reduction of the coercive field associated with said impurity doping method. In said method, stabilization of reversed domain structures by inhibiting the relaxation of spontaneous polarization from switching back to its original direction can be achieved by using a high peak reverse voltage (>20 kV) rectifier with low leak current (<0.5 $\mu$A) and a fast rising time (>100 ns).

Furthermore, the congruent grown ferro-electric non-linear optical crystals can be $LiNb_xTa_{1-x}O_3$, and the x is $0 \leq x \leq 1$.

BRIEF DESCRIPTION OF THE DRAWINGS

The advantages of the present invention can be understood by the following drawings and descriptions.

Figure 11:
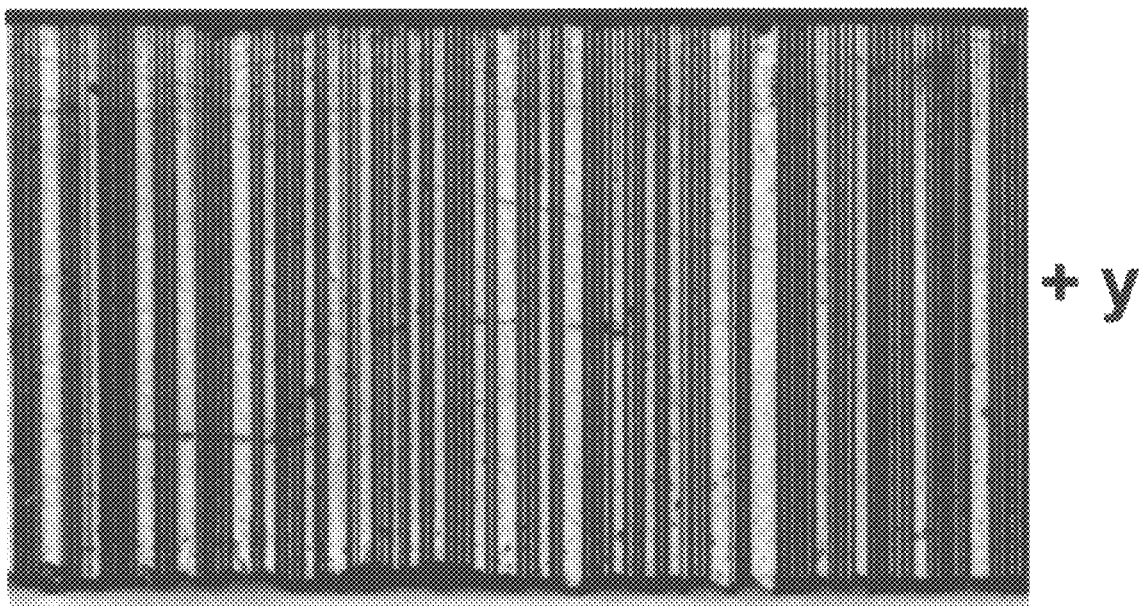
FIG. 11 is the scanned image of the successfully implemented bulk type of periodically poled lithium niobate (PPLN) with a period of $\Lambda=2L_c=6.8$ $\mu$m in accordance with the embodiment of the present invention.

ENCLOSE 1 is a real picture of the successfully implemented bulk type of periodically poled lithium niobate in accordance with FIG. 11.

Figure 12:
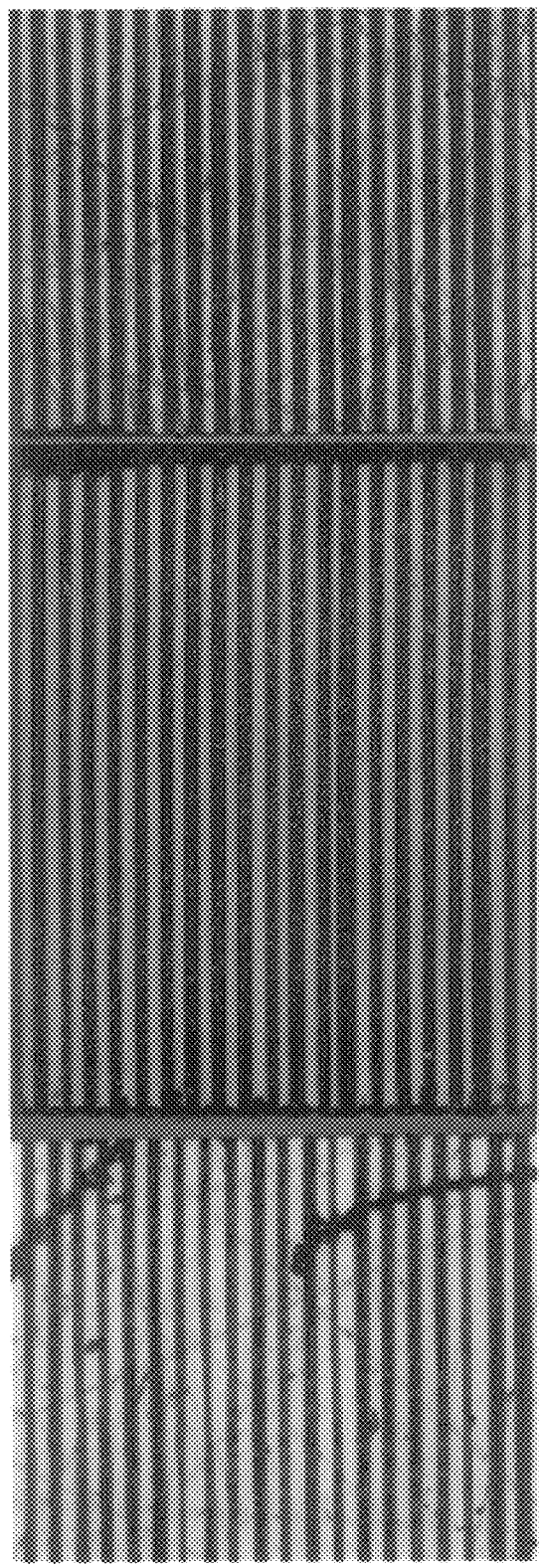
FIG. 12 is the scanned image of the successfully implemented bulk type of periodically poled zinc oxide doped lithium niobate (ZnO:PPLN) with a period of $\Lambda=2L_c=20$ $\mu$m in accordance with the embodiment of the present invention.

ENCLOSE 2~4 are real pictures of the successfully implemented bulk type of periodically poled zinc oxide doped lithium niobate in accordance with FIG. 12.

DETAILED DESCRIPTION OF THE INVENTION

Hereinafter, preferred embodiments of the present invention will be described in detail with reference to the accompanying drawings.

The present invention relates to a method for bulk periodic poling of congruent grown ferro-electric nonlinear optical crystals by low electric field, and more particularly, to a method, in which the congruent grown ferro-electric non-linear optical crystal is adequately doped with oxide so as to reduce the coercive and internal field in the congruent grown bulk ferro-electric non-linear optical crystals and to reduce the axial anisotropy when bulk type of periodical poling of the congruent grown ferro-electric nonlinear optical crystals are being implemented. By adequately doping the congruent grown ferro-electric non-linear optical crystal with the suitable concentration of zinc oxide, the coercive fields necessary in making a 180° domain reversal in the congruent grown ferro-electric nonlinear optical crystals, and the internal field associated with the non-stoichiometric growth of congruent grown ferro-electric nonlinear optical crystals can be substantially reduced. In addition, the fringe field effect at the edge of the electrodes in preparing the periodically poled quasi-phase matching structures can thus be minimized.

Said congruent grown ferro-electric non-linear optical crystals can be $LiNb_xTa_{1-x}O_3$ wherein $0 \leq x \leq 1$, preferably the congruent grown ferro-electric non-linear crystals are lithium niobate ($LiNbO_3$) and lithium tantalate ($LiTaO_3$). On the other hand, said dopant oxide can be zinc oxide (ZnO) and magnesium oxide (MgO), and the doping concentration must be higher than 0.5 mol. %.

Figure 1:
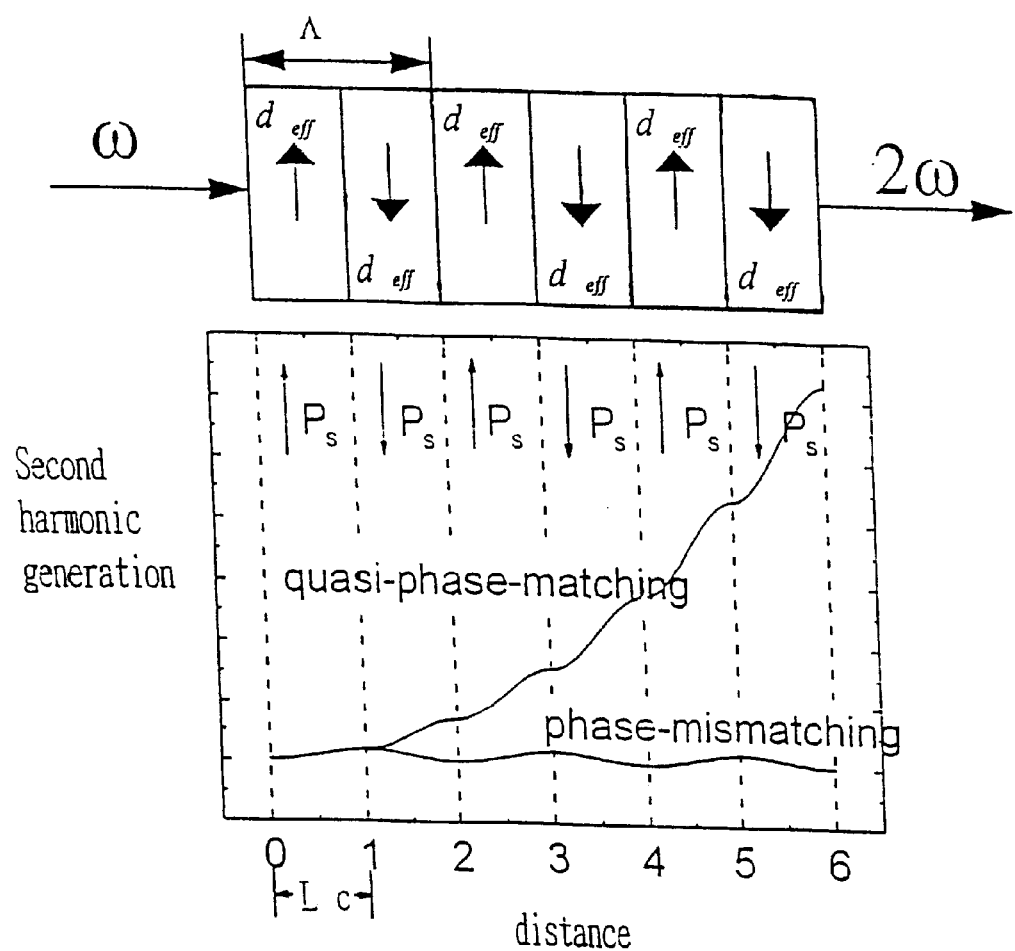
FIG. 1 illustrates the concept of quasi-phase matching by periodically modulating the polarity of the second order nonlinear optical coefficient in accordance with the embodiment of the prior art.
Figure 2:
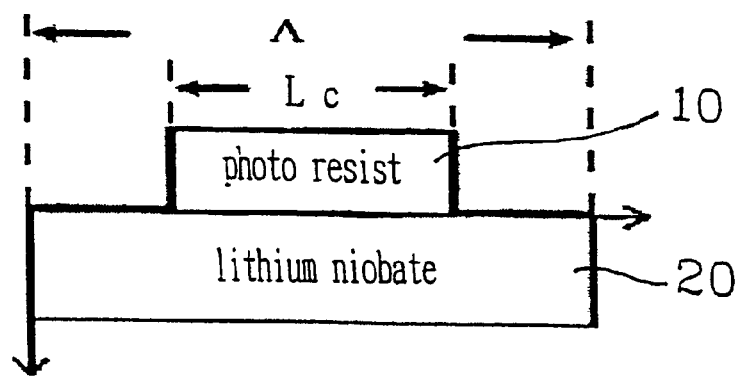
FIG. 2A illustrate the cross sectional view in preparing the conventional bulk periodically poled lithium niobate device in accordance with the embodiment of the prior art.
FIG. 2B and 2C in association with FIG. 2A are two schematic diagrams illustrating that the fringe field effect of the prior art, which arises from the discontinuity of dielectric distribution in preparing the periodically poled lithium niobate, can result in discontinuity of electric field distribution at the edges of the electrodes such that the lateral 180° domain motion will not be restricted to the area defined by the patterned electrodes. The latter can result in a loss of 50-50% duty cycle fidelity in the quasi-phase matched structures as shown in FIG. 1 and thus cause a great reduction in the nonlinear frequency conversion efficiency.
Figure 2:
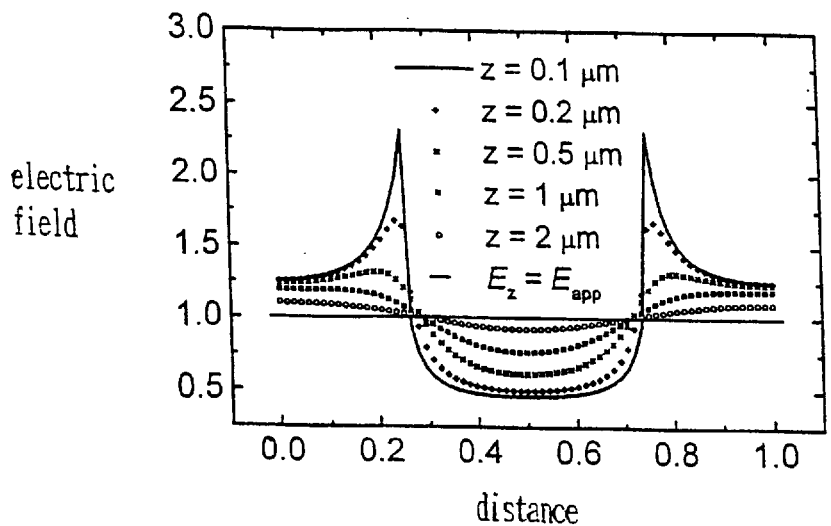
Figure 2:
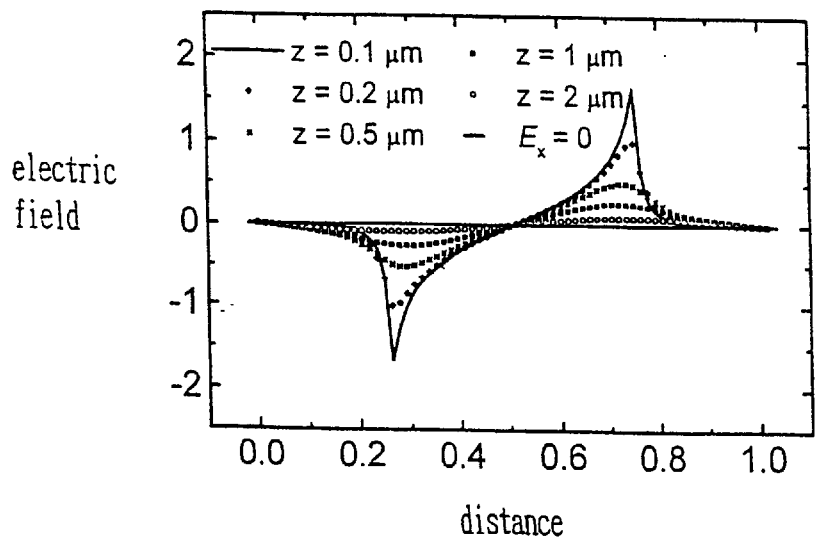
Figure 3:
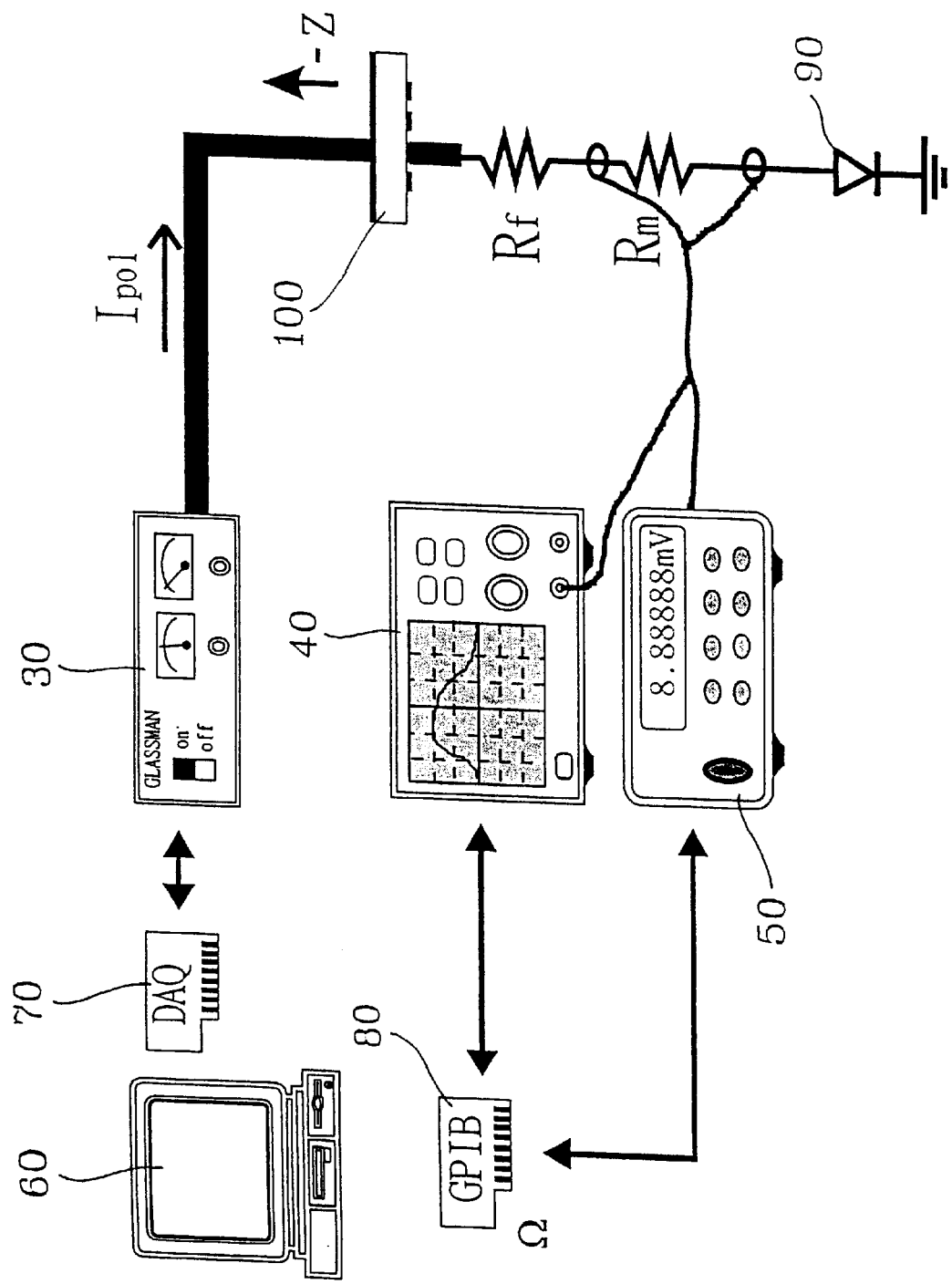
FIG. 3 illustrates the fabrication system in association with the method that can effectively stabilize the reversed domain structures by inhibiting the relaxation of spontaneous polarization from switching back to its original direction in accordance with the embodiment of the present invention.

As for the operation of the oxide doped non-linear optical crystals and the real-time monitoring the 180° polarization switching process in preparing the periodically poled quasi-phase matching devices, please refer to FIG. 3, which illustrates the fabrication system in accordance with the embodiment of the present invention that can effectively stabilize the reversed domain structure by inhibiting the charge back flow associated with the relaxation of the spontaneous polarization to its original direction in said nonlinear congruent grown ferroelectric crystal 100 at the termination of high voltage poling process. Said fabrication system comprises a high voltage supply 30, which either can be of direct current (DC) or pulse type and provides the crystal 100 with an electric field larger than the corresponding coercive field in order to proceed with the 180° domain reversal poling process, wherein the arrow of −Z denotes the substrate orientation of the to-be-measured lithium niobate device; a computer 60, which is connected to a data acquisition card (DAQ) 70 and a general purpose interface board (GPIB) 80, in which said DAQ 70 is controlled by said computer 60 to make the timing control of DAQ 70 so as to further control said high voltage supply 30, and said GPIB 80 is used to connect with said current monitor 50 and said computer 60 to provide the real-time monitoring of applied poling voltage and the polarization switching current.

As shown in FIG. 3, said measuring system further comprises a current monitor 50, which is connected to a set of current monitoring resistors $R_f$ and $R_m$ so as to measure the magnitude of the polarization switching current. Said current monitoring resistors $R_f$ and $R_m$ are connected to said non-linear optical crystal 100 so as to measure the current flowing through said non-linear optical crystal 100 during said 180° domain reversal, that is, polarization switching, process. Said measuring system further comprises a high voltage bearing rectifier 90, which is connected to the end of said current monitoring resistors $R_f$ and $R_m$ so as to inhibit the charge back flow associated with the relaxation of the spontaneous polarization back to its original direction at the termination of said high voltage power supply.

The previously discussion is under the condition in that the supply source is of direct current (DC). However, said high voltage supply 30 can also be pulse type and connected to an oscilloscope 40 which is connected to said general purpose interface board (GPIB) 80 to provide the real-time monitoring of the applied pulse voltage and the polarization switching current through the use of current monitor resistors $R_f$ and $R_m$.

In accordance with FIG. 3, said measuring system further comprises a procedure of fabricating the periodically poled quasi-phase matching structures including the following steps:

a. defining the electrode pattern by photo-lithography and implementing the metal electrodes by evaporation a thin film of aluminum (Al) on the +Z face of lithium niobate;

b. applying high voltage to the patterned Al electrodes through liquid interface with aqueous solutions consisted of alkaline salt to initiate the poling process and to prevent the dielectric breakdown from occur, further use said rectifier to stabilize the reversed domains by inhibiting the relaxation of the spontaneous polarization back to its original direction through the process of charge back flow as the high voltage power supply is switched off at the termination of the poling process;

c. utilizing an etching solution of composed of a ratio of HF:$HNO_3$=1:2 to etch the +Y face of lithium niobate so as to observe the periodically poled structure of said congruent grown ferro-electric non-linear optical crystal 100. The procedure of observing the periodically poled structure of said congruent grown ferro-electric non-linear optical crystal 100 is thus completed.

From the above procedure of operation and measuring, it is obvious that one of the major contributions of the present invention is that it can effectively stabilize the reversed domain structures by inhibiting the charge back flow associated with the relaxation of the spontaneous polarization back to its original direction when the high voltage power supply is switched off at the end of the poling process. To achieve such an object, there is placed a rectifier 90 as shown in FIG. 3. Said rectifier 90 is characterized by high response speed (with a rising time smaller than one hundred nano seconds, that is, 100 ns), high voltage bearable (with peak reverse voltage larger than twenty kilo volts, that is, 20 kV), and low leakage diode (with a reverse current less than half micro-ampere, that is, 0.5 $\mu$A). Said rectifier 90 can be a diode qualified to be high speed, i.e. with a rising time smaller than one hundred nano-seconds (<100 ns); high voltage bearable, i.e. able to bear a peak reverse voltage as high as twenty kilo-volts (>20 kV); low leakage, i.e. with a leakage current smaller than half a micro-ampere (<0.5 $\mu$A). The area under periodically poling can be real-time monitored according to the following formula:

$$Q=2P_sA=\int idt$$

where $P_s$ is the surface density of spontaneous polarization on Z-cut lithium niobate in unit of Coulomb/$m^2$;

A is the area that has just reversed the spontaneous polarization in the periodic poling process;

i is the polarization switching current during the poling process.

Figure 4:
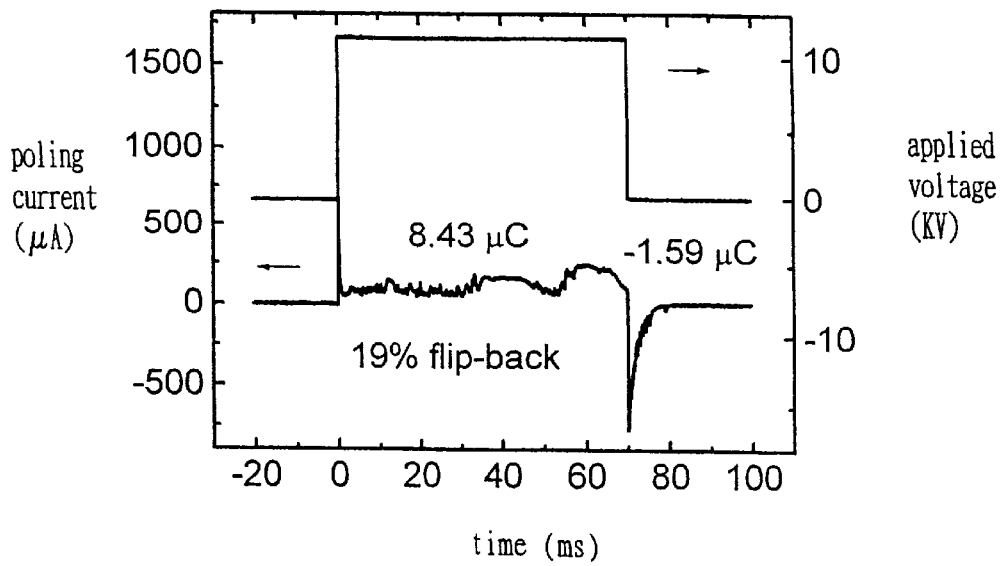
FIG. 4A illustrates the time evolution of the poling current in the conventional periodical poling process on lithium niobate without a rectifying diode in accordance with the prior art. Note the lithium niobate substrate thickness is 500 $\mu$m.
FIG. 4B illustrates the time evolution of the poling current in the newly developed periodical poling process on lithium niobate with a rectifying diode in accordance with the embodiment of the present invention. Note the lithium niobate substrate thickness is 500 $\mu$m.
Figure 4:
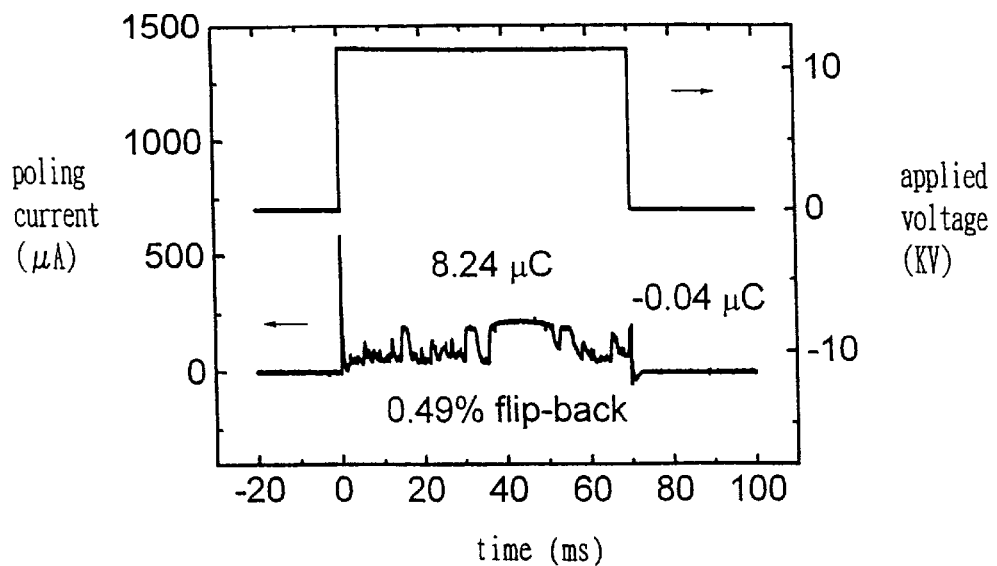

As for the function of said rectifier 90, please refer to FIG. 4A and FIG. 4B, which monitors the polarization switching current during the periodic poling process in lithium niobate of substrate thickness five hundred micrometers (500 $\mu$m), with an applied pulse voltage of 11 kV and a pulse width of 70 milli-seconds (70 ms). It is also noted that FIG. 4A illustrates the time evolution of the polarization switching current in the conventional fabrication process of bulk periodically poled lithium niobate without using a rectifying diode in accordance with the embodiment of the prior art, while FIG. 4B reveals the time evolution of the polarization switching current in the bulk periodical poling process on lithium niobate using a recting diode in accordance with the embodiment of the present invention. Furthermore, when there is no rectifying diode as shown in FIG. 4A, the switching off of the high voltage supply 30 results in a relaxation of the spontaneous polarization such that 20% of the reversed domain flips back to its original direction, which appears in a form of charge back flow. However, as shown in FIG. 4B, the use of said high voltage rectifying diode 90 can effectively stabilize the reversed domain structures by inhibiting the relaxation of the spontaneous polarization from switching back to its original direction as one terminates the high voltage power supply at the end of periodical poling process, in which only 0.5% of the charge flows back occurs. Evidently, as shown in FIG. 4B, the process of charge back flow current at the 70th milli-seconds (ms) has been greatly reduced.

For additional function of said rectifier 90, please refer to FIG. 11, which is the scanned image of the successfully implemented bulk type of periodically poled lithium niobate (PPLN) with a period $\Lambda=2L_c=6.8$ $\mu$m on a substrate of thickness 500 $\mu$m in accordance with the embodiment of the present invention. Even though the congruent grown lithium niobate substrate suffers from large coercive field, with said rectifier 90, bulk type of periodically poled lithium niobate with a small period such that $2L_c=6.8$ μm can be successfully realized on a substrate of 500 μm in thickness. Please also refer to APPENDIX 1, which is a real picture of the successfully implemented bulk type of periodically poled lithium niobate in accordance with FIG. 11.

Figure 5:
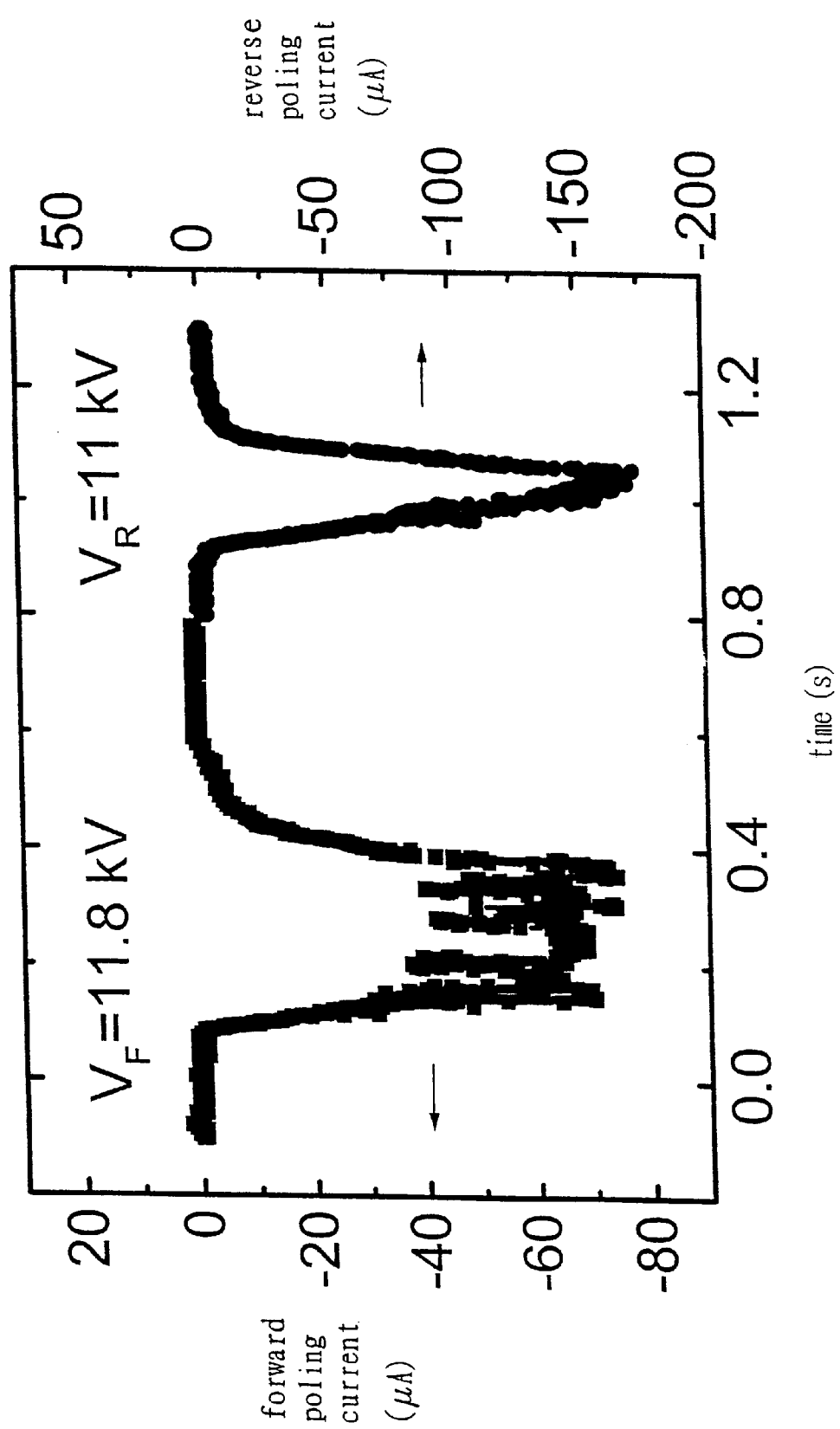
FIG. 5 illustrates the different wave forms with respect to different polarities of the congruently grown lithium niobate substrate in accordance with the embodiment of the present invention. The forward poling refers to a change of the spontaneous polarization of lithium niobate from the crystal +Z axis to –Z axis, and reverse poling refers to the switching back of said polarization to its original direction.

FIG. 5 illustrates the wave forms of the polarization switching current in the forward and reverse poling direction, respectively, on the congruent grown lithium niobates with the embodiment of the present invention, where the horizontal axis denotes the switching time in unit of second, while the left and right axis measures the polarization switching current in unit of micro-ampere (μA) in the forward, and reverse poling direction. It is noted that polarization switching in the forward poling direction requires a higher applied voltage of $V_F=11.8$ kV across a 500 μm thick lithium niobate substrate than that in the reverse poling direction of $V_R=11$ kV. Moreover, it is noted the former results in a smaller polarization current and longer polarization switching time compared with the case in reverse poling.

Figure 6:
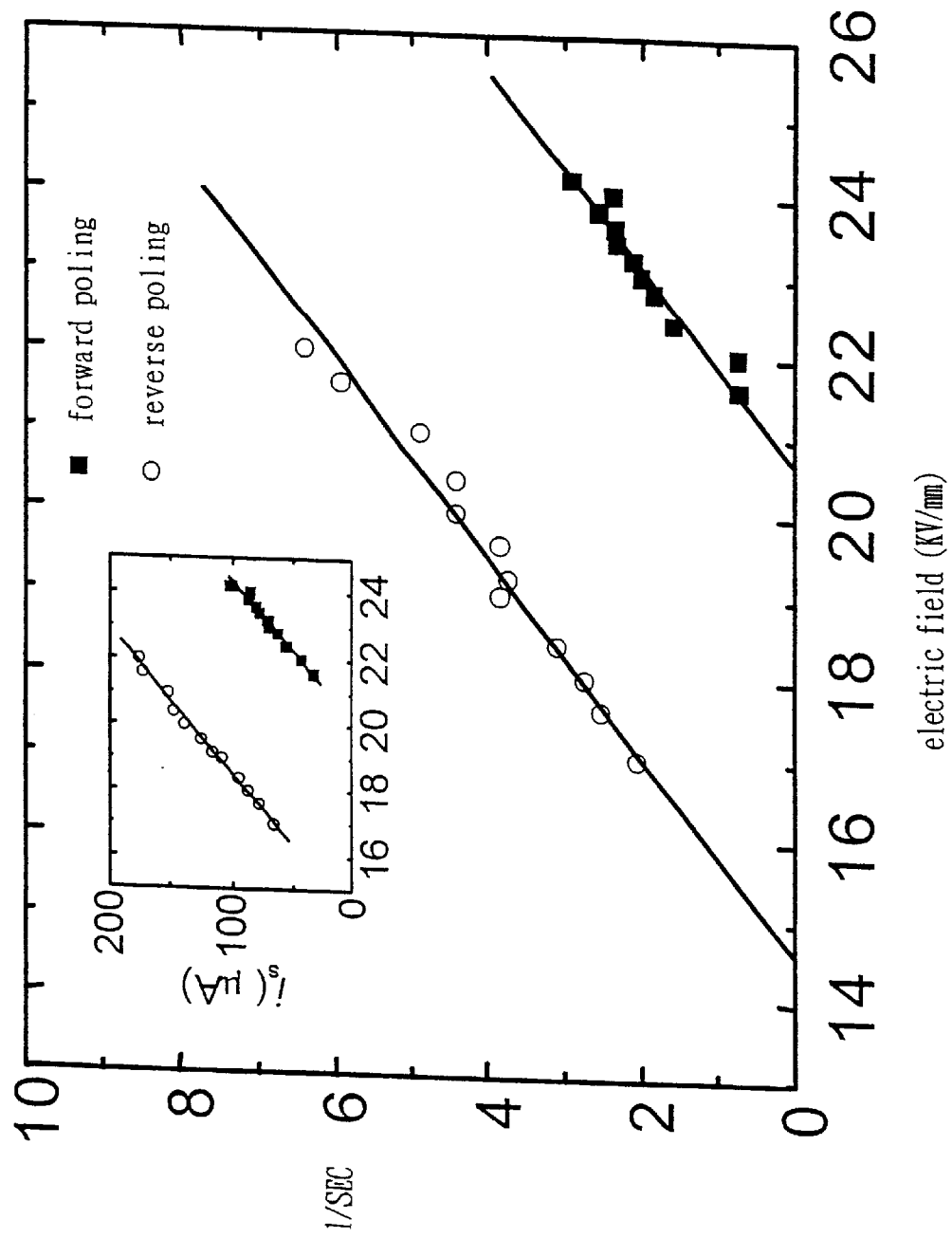
FIG. 6 illustrates the polarization switching rate (in unit of 1/sec) and polarization switching current (in unit of $\mu$A) in the forward and reverse poling conditions by using the newly proposed mobility model $v=\mu_s[E-(E_{th} \pm E_{int})]$ in accordance with the embodiment of the present invention. Note here the positive (+) sign in $(Et_{th} \pm E_{int})$ refers to the case of forward poling while the negative (–) sign refers to the reverse poling case.

Please refer to FIG. 6, which illustrates the electric field dependence of the polarization switching rate (in unit of 1/sec) and the polarization switching current in the forward and reverse poling direction using the newly proposed mobility model, i.e., $v=\mu_s[E-(E_{th}\pm E_{int})]$ in accordance with the embodiment of the present invention. In said model, the positive (+) sign in the formula of $(E_{th}\pm E_{int})$ refers to the case of forward poling while the negative (−) sign refers to the case of reverse poling, by which the forward poling refers to the change of the spontaneous polarization of lithium niobate from its +Z axis direction to the −Z axis direction, while the reverse poling refers to the switching of the spontaneous polarization back to its original direction in the crystal +Z axis. By using said mobility model in analyzing the axial anisotropy in the polarization switching process on the congruent grown lithium niobates as shown in FIG. 6, one can deduce an internal field strength $E_{int}$ of 3 kV/mm and a threshold electric field $E_{th}$ of 17.6 kV/mm, and a lateral mobility $\mu_s$ of 1.56 mm²/kV−s along horizontal orientation.

Figure 7:
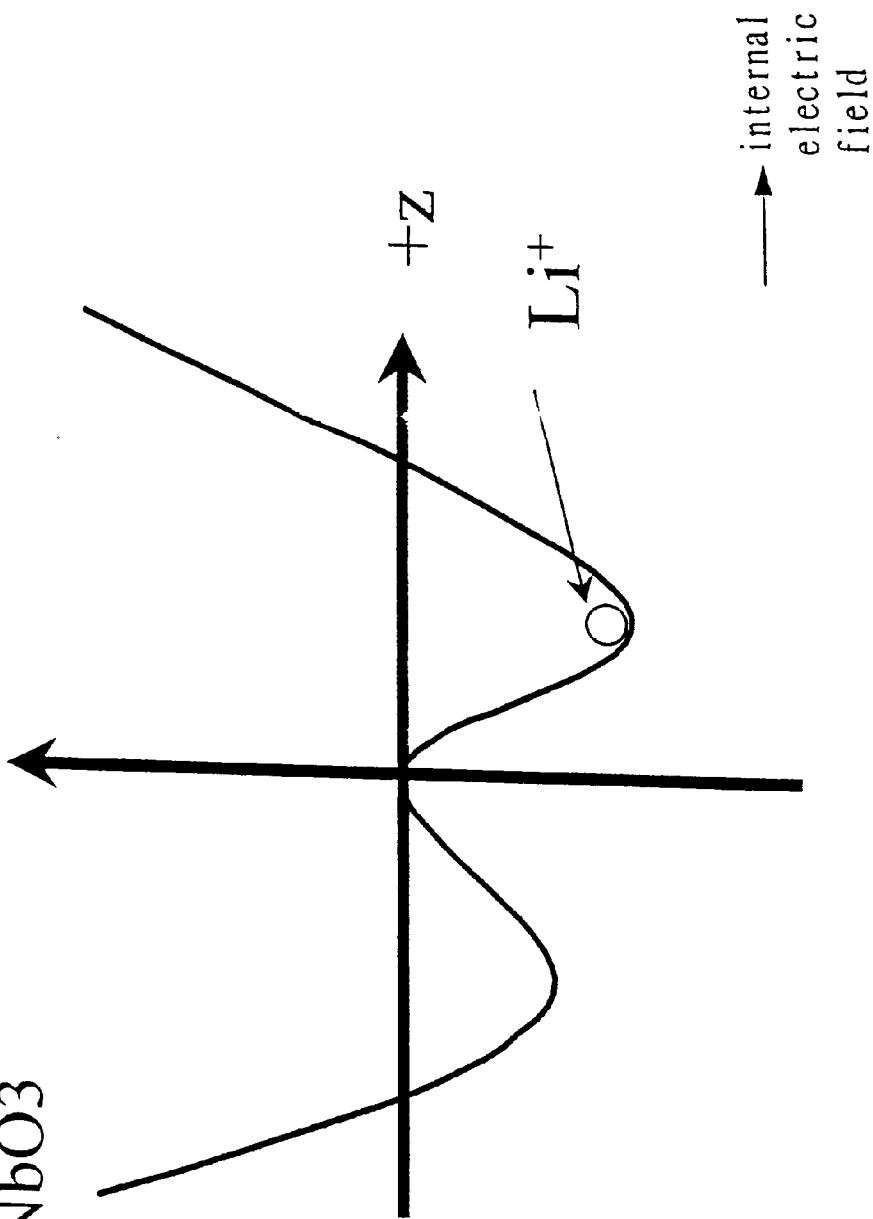
FIG. 7 illustrates the internal field induced axial anisotropy in the domain reversal process in accordance with the embodiment of said mobility model of the present invention.

Please refer to FIG. 7, which illustrates the proposed potential barrier diagram in the oxygen plane of congruent grown lithium niobate of said mobility model in explaining the axial anisotropy of the polarization switching current and switching voltage in the forward and reverse poling direction observed in FIG. 6. An internal field in known to exist in the lithium niobate crystal due to the non-stoichiometric point defects associated with the congruent growth mechanism. The action of such an internal field can cause a splitting of the degenerate potential minima across said oxygen plane. As a result, the potential valley on the upper side of said oxygen plane, which is referred to as in the +Z direction, would have a potential energy lower than that on the lower side of the oxygen plane, which is referred to as in the −Z direction. As a result, the Li⁺ atom must acquire a higher kinetic energy in order to surmount the barrier to move from the right valley (in +Z direction) to the left valley (in −Z direction), that is, to switch its polarization from +Z to −Z direction in the forward poling case. In comparison, polarization switching in the reverse poling case would require less kinetic energy due to lower potential barrier height.

In said mobility model, the lateral motion of the 180° switched domain can be described according to $v=\mu_s[E-(E_{th}\pm E_{int})]$. With a given applied field strength, the action of axial anisotropy due to the internal field is such that a higher lateral swept velocity, hence a higher polarzation switching current associated with the domain reversal in the reverse poling direction is resultant compared with the case in the forward poling direction as have been shown in FIG. 5 and FIG. 6.

Although congruent crystal growth technique has been shown as a cost-effective method for mass-production of congruent grown ferro-electric nonlinear optical crystals, such method however unavoidably results in crystals with non-stoichiometry, and hence inherent internal field associated the non-stoichiometric point defects such as anti-site defects or vacancy. For example, the congruent grown lithium niobate (LiNbO₃) has a non-stoichiometric ratio of $Li_2O/[Li_2O+Nb_2O_5]=0.484$. The said zinc oxide doped lithium niobate in the embodiment of the present invention contains zinc oxide as dopant, whose usage is to refill the vacancy associated with the congruent grown lithium niobate crystals. This is base on the concept that the bond length of the zinc oxide atom is 1.98 angstroms (Å), which is very close to that of lithium oxide (Li₂O, 2.0 angstroms). Consequently, by adding suitable amount of zinc oxide in lithium niobate, one can gradually reduce the non-stoichiometric point defects associated with the congruent grown lithium niobate. As a result, the internal field $E_{int}$ associated with the non-stoichiometric point defects in the congruent grown crystals can thus be minimized. Moreover, the threshold field $E_{th}$ that is related to the polarization switching of the congruent grown ferro-electric nonlinear optical crystal, that is, the normally called coercive filed, and the fringe field that hinges on the action of the former, can thus be greatly reduced.

Figure 8:
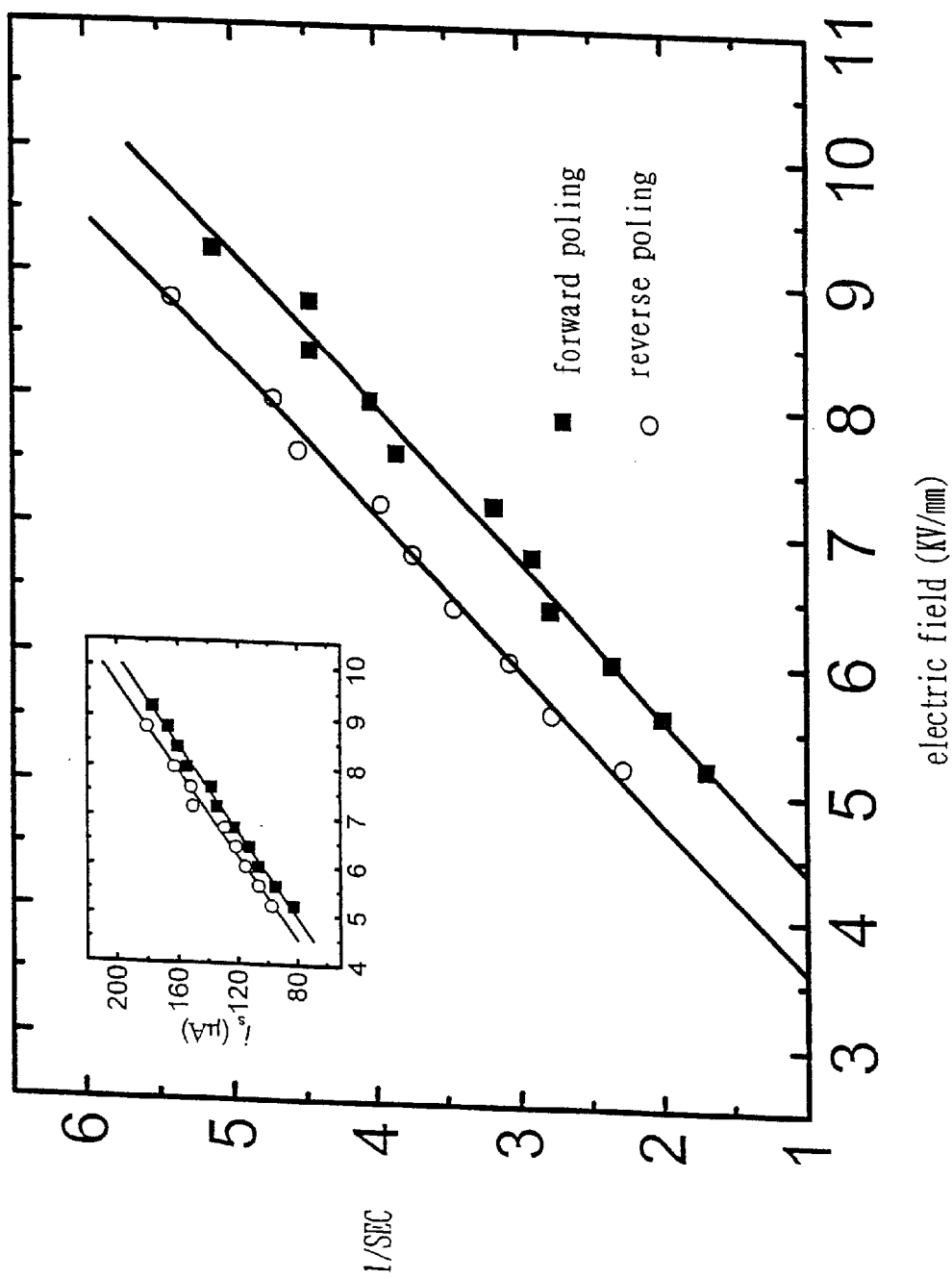
FIG. 8 illustrates the polarization switching rate (in unit of 1/sec) and polarization switching current (in unit of $\mu$A) in the newly proposed mobility model on zinc oxide doped lithium niobate in accordance with the embodiment of the present invention.

Please refer to FIG. 8, which illustrates the electric field dependence of the polarization switching rate (in unit of 1/sec) and the polarization switching current in the forward and reverse poling direction of 5 mol. % zinc oxide doped lithium niobate in 500 μm thickness in accordance with the embodiment of the present invention, wherein the internal electric field is decreased to 0.45 kV/mm, and also, the equivalent threshold electric field $E_{th}$ is reduced to 3.5 kV/mm and the lateral mobility $\mu_s$ of 1.61 mm²kV−s.

Figure 9:
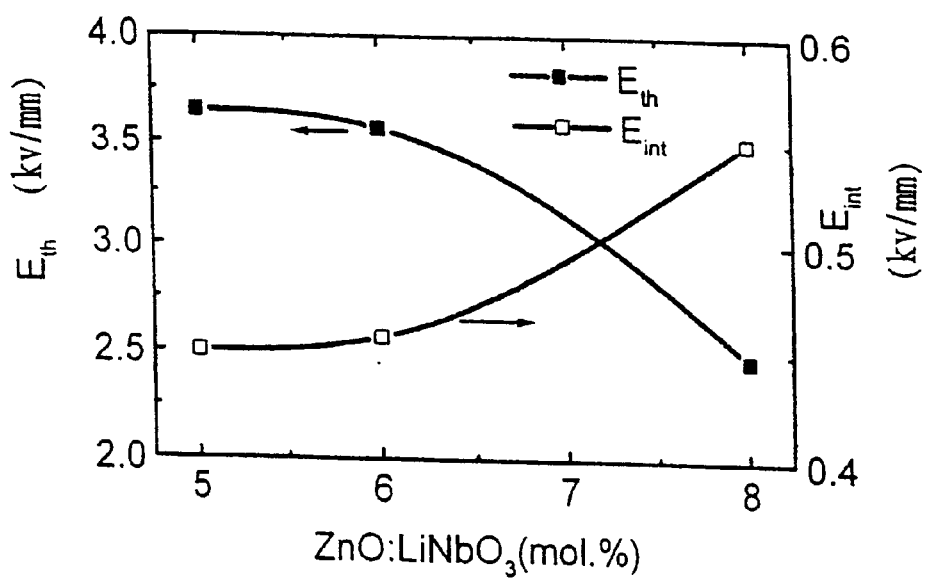
FIG. 9 illustrates the measured threshold field ($E_{th}$), and the internal field ($E_{int}$) in various zinc oxide doped lithium niobates in accordance with said mobility model analysis in the present invention.

Please refer to FIG. 9, which illustrates the measured threshold field $E_{th}$ and the inter field $E_{int}$ on various concentration of zinc oxide (in unit of mol. %) doped lithium niobate substrates of 500 μm thickness using said mobility model analysis on the field dependence in the polarization switching rate and current that are similar to those shown in FIG. 6 and FIG. 8. It can be see from FIG. 9 that the threshold field $E_{th}$ that is related to the coercive field in initiating the polarization switching in lithium niobate has dramatically reduced to 2.5 kV/mm in 8 mol. % zinc oxide doped lithium niobate, whereas in the undoped congruent grown lithium niobate a much higher $E_{th}$ of 17.6 kV/mm can be inferred from data shown in FIG. 6. In addition, it is shown in FIG. 9 that the internal field $E_{int}$ it in the zinc oxide doped congruent grown lithium niobate can be effectively reduced to be less than 0.55 kV/mm, which is one order of magnitude smaller than that in the undoped congruent grown lithium niobate but similar to that of stoichiometric grown lithium niobate. Such observations verify the concept that by said impurity doping method, one can effectively minimize the non-stoichiometric point defects associated with the congruent crystal growth, and hence greatly reduce the internal and coercive field in periodical poling of said congruent grown ferro-electric nonlinear optical crystals.

Figure 10:
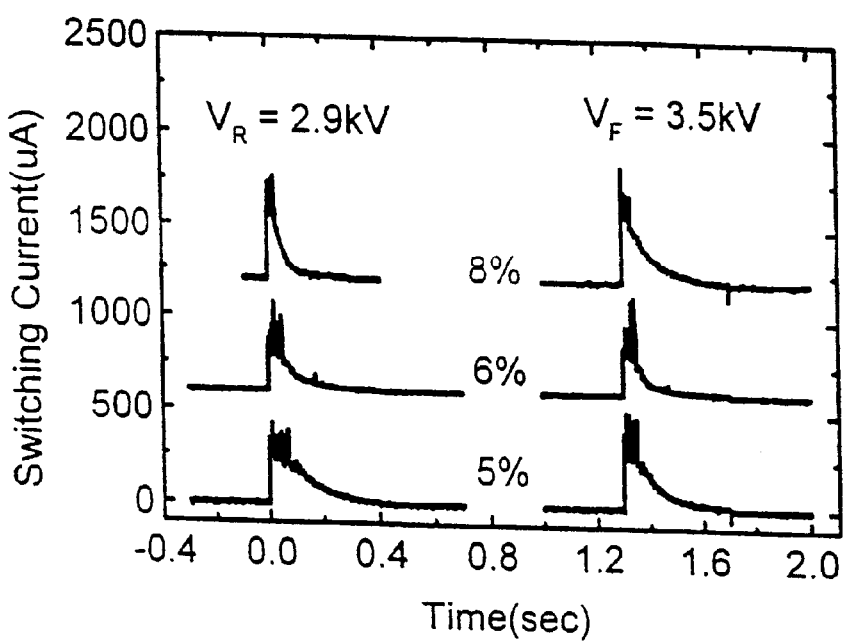
FIG. 10 illustrates the measured polarization switching current in the forward and reverse poling directions in various zinc oxide doped lithium niobates in accordance with said doping method in the present invention.

Please refer to FIG. 10, which illustrates the time evolution of the polarization switching current in the forward and reverse poling direction on various zinc oxide doped lithium niobate substrates. As can be used to verify the said impurity doping method in reducing the internal and coercive field strength, data shown in FIG. 10 reveals that larger switching current and smaller switching time can be achieved with the increase of zinc oxide doping in the congruent grown lithium niobate. The letter indicates a reduction of the crystal non-stoichiometry has been effectively taken place by zinc oxide doping.

Please also refer to FIG. 12, which is the scanned image of the successfully implemented bulk type of periodically poled 5 mol. % zinc oxide doped lithium niobate of 500 $\mu$m thickness. As for the real pictures of the successfully implemented bulk type of periodically poled 5 mol. % zinc oxide doped lithium niobate in accordance with FIG. 12, please refer to APPENDIX 2~4, wherein APPENDIX 2 shows the picture of the +Z face, APPENDIX 3 shows the picture of the Y face, and APPENDIX 4 shows the picture of the −Z face. Accordingly, the successfully implemented bulk type of periodically poled 5 mol. % zinc oxide doped lithium niobate with a period $\Lambda=2L_c=20$ $\mu$m on a substrate of 500 $\mu$m in thickness as presented above demonstrates the feasibility of the embodiment of the present invention to overcome the problems of the prior arts.

As discussed above, the present invention relates to a method for bulk periodic poling of congruent grown ferroelectric nonlinear optical crystals by low electric field, and more particularly, to a method in which the congruent grown ferro-electric non-linear optical crystal is adequately doped with oxide so as to reduce the internal field, coercive field, and the associated fringe field effects in bulk periodical poling of congruent grown bulk lithium niobate and lithium tantalate and to reduce the axial anisotropy when bulk type of periodical poling of lithium niobate and lithium tantalate are being implemented.

Although this invention has been disclosed and illustrated with reference to particular embodiments, the principles involved are susceptible for use in numerous other embodiments, which will be apparent to persons skilled in the art. This invention is, therefore, to be limited only as indicated by the scope of the appended claims.

What is claimed is:

1. A method for bulk periodic poling of congruent grown ferro-electric nonlinear optical crystals by low electric field, in which the congruent grown ferro-electric nonlinear optical crystal is adequately doped with oxide so as to reduce the internal field, coercive field, and the associated fringe field effects in bulk periodical poling of the congruent grown nonlinear optical crystals and to reduce the axial anisotropy when bulk type of periodical poling of the congruent grown ferro-electric nonlinear optical crystals are being implemented.

2. The method for bulk periodic poling of congruent grown ferro-electric nonlinear optical crystals by low electric field as recited in claim 1, in which said congruent grown ferro-electric non-linear optical crystal can be $LiNb_xTa_{1-x}O_3$ and the x is $0 \leq x \leq 1$.

3. The method for bulk periodic poling of congruent grown ferro-electric nonlinear optical crystals by low electric field as recited in claim 2, in which said congruent grown ferro-electric non-linear optical crystal is lithium niobate ($LiNbO_3$).

4. The method for bulk periodic poling of congruent grown ferro-electric nonlinear optical crystals by low electric field as recited in claim 2, in which said congruent grown ferro-electric non-linear optical crystal is lithium tantalate ($LiTaO_3$).

5. The method for bulk periodic poling of congruent grown ferro-electric nonlinear optical crystals by low electric field as recited in claim 1, in which said dopant oxide can be zinc oxide (ZnO) or magnesium oxide (MgO).

6. The method for bulk periodic poling of congruent grown ferro-electric nonlinear optical crystals by low electric field as recited in claim 1, in which the doping concentration of said dopant oxide must be larger than 0.5 mol. %.

7. The method for bulk periodic poling of congruent grown ferro-electric nonlinear optical crystals by low electric field as recited in claim 1, in which, for the fabrication of the periodically poled congruent grown ferro-electric non-linear optical crystals and the measurement of characteristics of the congruent grown ferro-electric non-linear optical crystals, the fabrication/measuring system comprises:

a high voltage supply, which either can be of direct current (DC) type or pulse type and provides the congruent grown ferro-electric nonlinear optical crystal with the source supply to implement the domain reversal, that is, polarization switching, process on said crystal;

a computer, which is connected to a data acquisition card (DAQ) and a general purpose interface board (GPIB), in which said DAQ is controlled by said computer to make the timing control of said DAQ so as to further control said high voltage supply, and said GPIB is used to connect with a current monitor and said computer to provide real-time monitoring of applied poling voltage and polarization switching current;

a current monitor, which is connected to a set of current monitoring resistors so as to monitor the magnitude of the polarization switching current;

a set of monitoring resistors that are connected to said congruent grown ferro-electric nonlinear optical crystal so as to measure the polarization switching current flowing through said congruent grown ferro-electric non-linear optical crystal;

a rectifier, which is connected to the end of said current monitoring resistors so as to stabilize the reversed domains by inhibiting the relaxation of the spontaneous polarization back to its original direction through the process of charge back flow as the high voltage power supply is switched off at the termination of the poling process.

8. The method for bulk periodic poling of congruent grown ferro-electric nonlinear optical crystals by low electric field as recited in claim 5, in which said high voltage supply can also be of pulse type and connected to an oscilloscope which is connected to said GPIB to provide the real-time monitoring of applied voltage and polarization switching current pulses.

9. The method for bulk periodic poling of congruent grown ferro-electric nonlinear optical crystals by low electric field as recited in claim 8, in which said rectifier must be a diode qualified to a rising time smaller than 100 ns, also be able to bear a peak reverse voltage more than 20 kV, further be a leakage current under 0.5 $\mu$A.

10. The method for bulk periodic poling of congruent grown ferro-electric nonlinear optical crystals by low electric field as recited in claim 7, in which said rectifier is a diode of high speed, high reverse voltage bearable, low leakage current.

11. The method for bulk periodic poling of congruent grown ferro-electric nonlinear optical crystals by low electric field as recited in claim 7, in which said fabrication system further comprises a procedure of preparing -the periodically poled structures including the following steps:

a. defining an electrode pattern by photo-lithography and implementing metal electrodes by evaporation of a thin film of aluminum (Al) on the +Z face of lithium niobate;

b. applying high voltage to the patterned Al electrodes through liquid interface with aqueous solutions consisted of alkaline salt to initiate the poling process and to prevent dielectric breakdown from occurring, and using said rectifier to stabilize the reversed domains;

c. utilizing an etching solution of composed of a ratio $HF:HNO_3=1:2$ to etch the +Y face of lithium niobate so as to observe the periodically poled structure of said congruent grown ferro-electric non-linear optical crystal.

12. An apparatus for effectively reducing the coercive field and stabilizing the reversed domain by inhibiting the relaxation of spontaneous polarization in the periodical poling process of congruent grown ferro-electric non-linear optical crystals, in which said congruent grown ferro-electric non-linear optical crystal is adequately doped with oxide so as to reduce the coercive and internal field in the congruent grown bulk congruent grown ferro-electric non-linear optical crystal; in which the coercive field and the associated fringe field effects in preparing the periodically poled structures can be reduced; in which the axial anisotropy when bulk type of periodical poling of the congruent grown ferro-electric non-linear optical crystals are being implemented can be reduced, and preparing the periodically poled structures from the congruent grown ferroe-lectric nonlinear optical crystals and real-time measurement of the periodical process, the fabrication system comprising:

a high voltage supply, which either can be of direct current (DC) type or pulse type and provides the congruent grown ferro-electric nonlinear optical crystals with the source supply to implement the domain reversal, that is, polarization switching, process on said crystal;

a computer, which is connected to a data acquisition card (DAQ) and a general purpose interface board (GPIB), in which said DAQ is controlled by said computer to make the timing control of said DAQ so as to further control said high voltage supply, and said GPIB is used to connect with a current monitor and said computer to provide real-time monitoring of applied poling voltage and polarization switching current;

an oscilloscope, which is connected to said GPIB to provide the real-time monitoring of applied voltage and polarization switching current pulses;

a current monitor, which is connected to a set of current monitoring resistors so as to monitor the magnitude of the polarization switching current;

a set of monitoring resistors that are connected to said non-linear optical crystal so as to measure the polarization switching current flowing through said congruent grown ferro-electric non-linear optical crystals;

a rectifier, which is connected to the end of said current monitoring resistors so as to stabilize the reversed domains by inhibiting the relaxation of the spontaneous polarization back to its original direction through the process of charge back flow as the high voltage power supply is switched off at the termination of the poling process.

13. The apparatus for bulk periodic poling of congruent grown ferro-electric nonlinear optical crystals by low electric field as recited in claim 12, in which said congruent grown ferro-electric non-linear optical crystal can be $LiNb_xTa_{1-x}O_3$, and the x is $0 \leq x \leq 1$.

14. The apparatus for bulk periodic poling of congruent grown ferro-electric nonlinear optical crystals by low electric field as recited in claim 13, in which said congruent grown ferro-electric nonlinear optical crystal is lithium niobate ($LiNb_3$).

15. The apparatus for bulk periodic poling of congruent grown ferro-electric nonlinear optical crystals by low electric field as recited in claim 13, in which said congruent grown ferro-electric non-linear optical crystal is lithium tantalate ($LiTaO_3$).

* * * * *